(12) United States Patent
Hattori

(10) Patent No.: US 6,821,451 B2
(45) Date of Patent: Nov. 23, 2004

(54) DRY ETCHING METHOD, MICROFABRICATION PROCESS AND DRY ETCHING MASK

(75) Inventor: Kazuhiro Hattori, Tokyo (JP)

(73) Assignee: TDK Corporation, Tokyo (JP)

( * ) Notice: Subject to any disclaimer, the term of this patent is extended or adjusted under 35 U.S.C. 154(b) by 184 days.

(21) Appl. No.: 09/816,784

(22) Filed: Mar. 26, 2001

(65) Prior Publication Data

US 2002/0096493 A1 Jul. 25, 2002

(30) Foreign Application Priority Data

Mar. 28, 2000 (JP) ........................................ 2000-088636

(51) Int. Cl.[7] ................................................ B44C 1/22
(52) U.S. Cl. ............................ 216/41; 216/47; 216/67; 438/706; 438/710
(58) Field of Search ................................ 438/706, 710, 438/712, 709, 720; 216/41, 47, 49, 58, 67

(56) References Cited

U.S. PATENT DOCUMENTS

| | | | | |
|---|---|---|---|---|
| 4,374,912 A | * | 2/1983 | Kaneki et al. ................. 430/5 |
| 5,422,312 A | * | 6/1995 | Lee et al. .................... 438/240 |
| 5,770,098 A | * | 6/1998 | Araki et al. .................. 216/67 |
| 5,874,010 A | * | 2/1999 | Tao et al. ..................... 216/22 |
| 5,946,167 A | * | 8/1999 | Hara et al. .................. 360/322 |
| 6,200,433 B1 | * | 3/2001 | Ding et al. ............. 204/192.15 |
| 6,287,975 B1 | * | 9/2001 | DeOrnellas et al. ......... 438/710 |
| 6,391,216 B1 | * | 5/2002 | Nakatani ..................... 216/41 |
| 6,421,212 B1 | * | 7/2002 | Gibbons et al. ....... 360/327.31 |
| 6,602,620 B1 | * | 8/2003 | Kikitsu et al. ........... 428/694 T |

FOREIGN PATENT DOCUMENTS

| | | |
|---|---|---|
| JP | 8-253881 | 10/1996 |
| JP | 11-080942 | 3/1999 |
| JP | 11-92971 | 4/1999 |
| JP | 11-293480 | 10/1999 |

OTHER PUBLICATIONS

–IEEE Transaction on Magnetics, vol. 32, pp4448–4451, Sep., 1996, Ultramicro Fabrications on Fe–Ni Alloys Using Electron–Beam Writing and Reactive– Ion Etching.

* cited by examiner

*Primary Examiner*—Lan Vinh
(74) *Attorney, Agent, or Firm*—Armstrong, Kratz, Quintos, Hanson & Brooks, LLP

(57) ABSTRACT

A dry etching is performed using a mask made of a tantalum or a tantalum nitride under a reaction gas of a carbon monoxide with an additive of a nitrogen containing compound gas.

8 Claims, 3 Drawing Sheets

DRY ETCHING METHOD, MICROFABRICATION PROCESS AND DRY ETCHING MASK

FIELD OF THE INVENTION

The present invention relates to a dry etching method for fabricating a microdevice such as for example a microsemiconductor device or a micromagnetic device, to a microfabrication process or method using this dry etching method and to a dry etching mask.

DESCRIPTION OF THE RELATED ART

When manufacturing a microdevice, such as a microsemiconductor device and a micromagnetic device, a microfabrication process utilizing both a lithography technology and an etching technology is executed abundantly.

The lithography technology is used to fabricate an etching mask by forming a micro-pattern on a photosensitive film such as a resist film coated on a surface of a work layer, and the etching technology is used to transfer thus formed micro-pattern of the etching mask to the work layer.

As one of the etching technology for providing a microstructure, there is a reactive ion etching method utilizing plasma of a low pressure reaction gas. If a plasma of a reaction gas $CF_4$ or $CCl_4$ is provided in the reactive etching of a magnetic material with transition metal elements such as Fe, Co or Ni for example as the main ingredient, a halogen compound can be formed as well as done in the reactive etching of a semiconductor material. However, since the halogen compound of the transition metal has an extremely higher coupling energy than that of a halogen compound of a semiconductor element, it is not only hard to evaporate but also is unaffected by the sputtering reaction. Therefore, an etching reaction of the transition metal halogen compound seldom progresses.

In order to solve these problems, a new reaction system using a plasma of a carbon monoxide gas had been developed and, by improving this system, a dry etching method using as a reaction gas a carbon monoxide gas with an additive of nitrogen consisting compound gas was proposed (Japanese patent publication 08253881A and Isao Nakatani, "Fabrications of Microstructures of Magnetic Materials", Jpn. J. Appl. Mag., Vol.22, No. 11, pp.1383–1389, 1998).

In these literatures, described are experimental results of a reactive ion etching on a permalloy thin-film using as a reaction gas a carbon monoxide (CO) gas with an additive of an ammonia ($NE_3$) gas in order to make a pattern with a size of about 0.6 $\mu$m, and of the similar reactive ion etchings on a silicon (100) monocrystal and on an aluminoborosilicate glass for comparison. The results are that a ratio of an etching rate of the silicon (100) monocrystal with respect to an etching rate of the permalloy is four, and that a ratio of an etching rate of the aluminoborosilicate glass with respect to an etching rate of the permalloy is nine.

However, in the latest etching process requesting a more fine etching pattern, if a ratio of etching rates between the mask and the work layer is so small as this level, it is difficult to transfer the fine pattern of the mask on the work layer with maintaining its precise shape. This is because the mask itself will be etched and will be deformed before the desired part of the work layer is entirely etched, and also because etching of the work layer will progress from mask edge due to side etching. Particularly, this tendency is strong in a pattern with a trench width or a line width of 0.1 $\mu$m or less and thus it is very difficult to transfer such the fine pattern on a work layer with keeping its precise shape.

SUMMARY OF THE INVENTION

It is therefore an object of the present invention to provide a dry etching method, a microfabrication method and a dry etching mask, whereby a microfabrication with keeping its precise shape can be performed.

According to the present invention, a dry etching method include a step of preparing a layer to be etched and a step of dry-etching the layer using a mask made of a tantalum or a tantalum nitride under a reaction gas of a carbon monoxide with an additive of a nitrogen containing compound gas.

According to the present invention, also, a microfabrication method includes a step of forming a mask made of a tantalum or a tantalum nitride on a layer to be etched, and a step of dry-etching the layer using the mask under a reaction gas of a carbon monoxide with an additive of a nitrogen containing compound gas.

In dry-etching process executed under a reaction gas of a carbon monoxide with an additive of a nitrogen containing compound gas, a tantalum or a tantalum nitride with a low etching rate is used as a mask material. Thus, it is possible to increase a ratio between the etching rate of the mask and that of the layer to be etched, and therefore the mask itself will not be deformed by etching and also etching of the layer to be etched will not progress from mask edge due to side etching. As a result, a fine micro-pattern can be transferred on the work layer with keeping its precise shape.

It is preferred that the step of forming a mask includes forming a resist pattern on the layer to be etched and then sputtering a mask layer using a tantalum target or a tantalum nitride target.

It is also preferred that the step of forming a mask includes forming a resist pattern on the layer to be etched and then reactive-sputtering a mask layer using a tantalum target under a reaction gas containing at least a nitrogen gas. In this case, the reaction gas containing at least a nitrogen gas may be a mixture gas of an argon gas and a nitrogen gas.

According to the present invention, furthermore, a dry etching mask used in dry-etching under a reaction gas of a carbon monoxide with an additive of a nitrogen containing compound gas is made of a tantalum or a tantalum nitride.

Further objects and advantages of the present invention will be apparent from the following description of the preferred embodiments of the invention as illustrated in the accompanying drawings.

DESCRIPTION OF THE PREFERRED EMBODIMENTS

FIGS. 1a–1f schematically illustrate a part of a microfabrication method in a preferred embodiment according to the present invention.

Figure 1A:
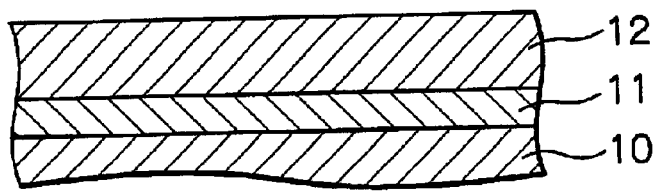
FIGS. 1a–1f show sectional views schematically illustrating a part of a microfabrication method in a preferred embodiment according to the present invention.

First, as shown in FIG. 1a, on an under layer 11 formed on a substrate 10, a microfabrication-work layer or a layer to be etched 12 is deposited. More concretely, for example, on the substrate 10 consisting of a three inches silicon wafer, a titanium (Ti) layer is deposited as the under layer 11 under the following conditions. Then, on the under layer 11, a cobalt-platinum (CoPt) alloy (Co: 75 at %, Pt: 25 at %) layer is deposited as the layer to be etched 12 under the following conditions.

Deposition Conditions of the Under Layer

| Target | 99.995% purity titanium |
|---|---|
| Background pressure | $9 \times 10^{-6}$ Pa |
| Entered gas | argon gas |
| Rate of gas flow | 30 sccm |
| Total gas pressure | 0.15 Pa (during deposition) |
| Applied power | DC 500 W |
| Temperature of substrate | room temperature (cooling by cold water, no temperature control) |

Deposition Conditions of the Layer to be Etched

| Target | 99.995% purity cobalt-platinum |
|---|---|
| Background pressure | $9 \times 10^{-6}$ Pa |
| Entered gas | argon gas |
| Rate of gas flow | 100 sccm |
| Total gas pressure | 2.0 Pa (during deposition) |
| Applied power | RF 500 W |
| Temperature of substrate | room temperature (cooling by cold water, no temperature control) |

Figure 1B:
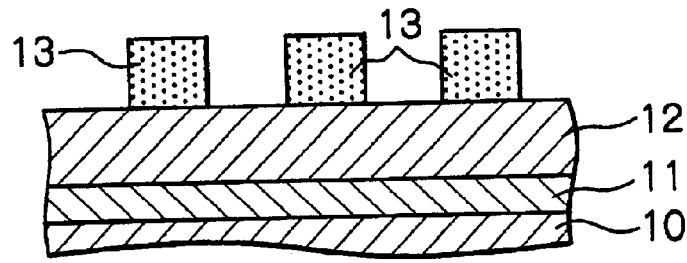

Then, as shown in FIG. 1b, on the layer to be etched 12, a resist layer 13 with a micro-pattern is formed by using a lithography technology. More concretely, for example, the patterned resist layer 13 is formed on the layer 12 by coating for example a positive type resist such as ZEP 520 with a thickness of 200 nm using the spin-coating method, by exposing a micro-pattern using an electron-beam exposure equipment, and then by developing the exposed resist pattern for five minutes at the room temperature using for example a developer ZED-N50 manufactured by Nihon Zeon Corp.

Figure 1C:
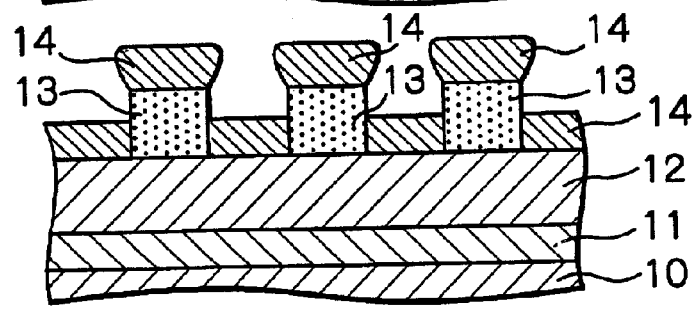

Then, as shown in FIG. 1c, on the micro-patterned resist layer 13 and on the layer to be etched 12, a mask layer 14 of a tantalum (Ta) is deposited. More concretely, for example, the tantalum layer is deposited by the sputtering method using an argon gas under the following conditions.

Deposition Conditions of the Mask Layer

| Target | 99.995% purity tantalum |
|---|---|
| Background pressure | $9 \times 10^{-6}$ Pa |
| Entered gas | argon gas |
| Rate of gas flow | 30 sccm |
| Total gas pressure | 0.15 Pa (during deposition) |
| Applied power | DC 500 W |
| Distance between target and substrate | 300 mm |
| Rotation of substrate | None |
| Temperature of substrate | room temperature (cooling by cold water, no temperature control) |

Figure 1D:
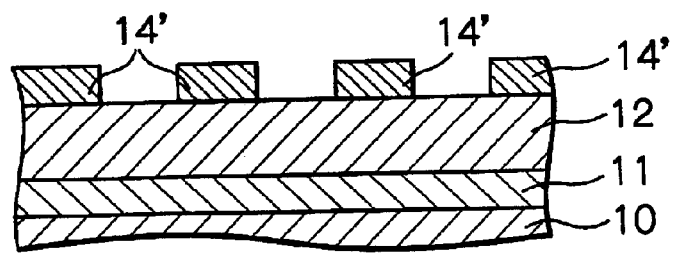

Then, as shown in FIG. 1d, the resist layer 13 is removed by the lift-off method to form a patterned mask 14'. More concretely, the lift-off is performed using an ultrasonic washer by dipping the wafer into a solvent such as a tetrahydrofuran.

Figure 1E:
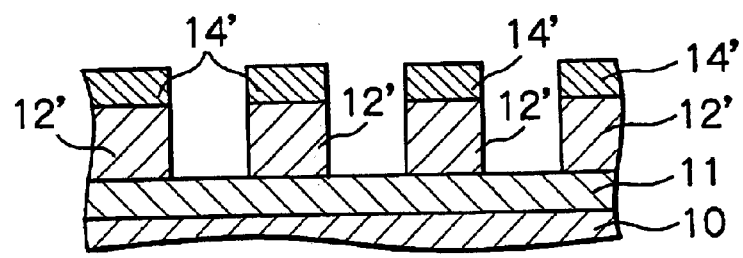
Figure 1F:
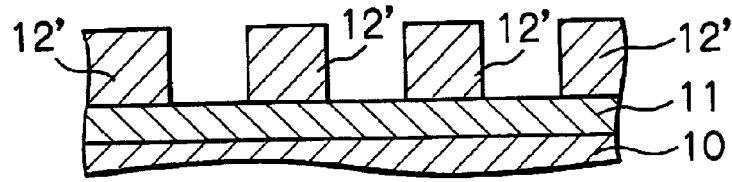

Thereafter, a reactive dry etching with a reaction mixture gas of ammonia and carbon monoxide is executed through the mask 14' to form a patterned or etched layer 12' shown in FIG. 1e.

Figure 2:
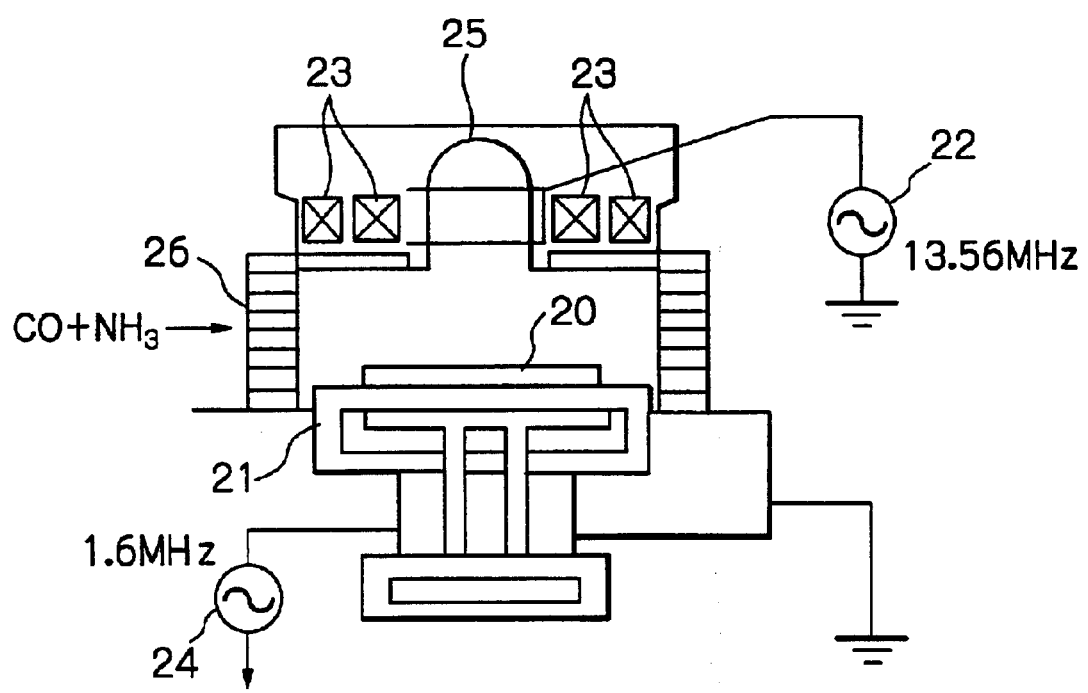
FIG. 2 shows a schematic view illustrating an example of a reactive ion etching equipment used in the embodiment shown in FIGS. 1d–1f.

FIG. 2 schematically illustrates an example of a reactive ion etching equipment used in this embodiment.

In the figure, reference numeral 20 denotes a wafer to be worked, 21 an ESC stage electrode for holding the wafer 20, 22 a RF power supply for generating a plasma (13.56 MHz), 23 an electromagnetic coil, 24 an RF bias power supply (1.6 MHz), 25 a quartz bell jar and 26 a diffusion chamber.

The etching conditions in this reactive etching equipment are as follows.

Reactive Dry Etching Conditions

| Entered gas | carbon monoxide gas and ammonia gas |
|---|---|
| Rate of carbon monoxide gas flow | 50 sccm |
| Rate of ammonia gas flow | 150 sccm |
| Total gas pressure | 6.0 Pa |
| Source power | 3 kW |
| Bias power | 1.2 kW |

Then, as shown in FIG. if, only the patterned or etched layer 12' with the micro-pattern is obtained by peeling off the mask 14'.

In this embodiment, the mask 14' is made of tantalum (Ta) with a very large ratio of the etching rate (etching selective ratio) with respect to cobalt-platinum alloy which makes the layer to be etched 12. As a result, according to this embodiment, the micro-pattern can be precisely transferred on the work layer.

Etching rates of various materials in the dry etching process using as a reaction gas a carbon monoxide gas with an additive of an ammonia gas were actually measured. Namely, samples were formed by depositing respectively a silicon dioxide ($SiO_2$), a titanium (Ti), a tantalum (Ta) and a cobalt-platinum alloy (CoPt) on a three-inches wafer under the same conditions as the aforementioned deposition conditions, and then the formed samples were dry-etched under the aforementioned dry etching conditions to measure the respective etching rates. The measured results and ratios in the measured etching rates (etching selective ratios) are shown in Table 1.

TABLE 1

| Material | Etching Rate (nm/min.) | Ratio in Etching Rate with respect to CoPt |
|---|---|---|
| $SiO_2$ | 12.5 | 3.6 |
| Ti | 3.6 | 12.4 |
| Ta | 1.7 | 26.3 |
| CoPt | 44.6 | — |

As shown in this table, the etching selective ratio of the titanium (Ti) is 12.4 whereas the etching selective ratio of the tantalum (Ta) is 26.3. Thus, if a mask is formed by the tantalum for the reactive dry etching using as a reaction gas a carbon monoxide gas with an additive of an ammonia gas, the mask itself will not be deformed by etching and also etching of the work layer will not progress from mask edge due to side etching. As a result, the fine micro-pattern can be transferred on a work layer with keeping its precise shape.

Figure 3A:
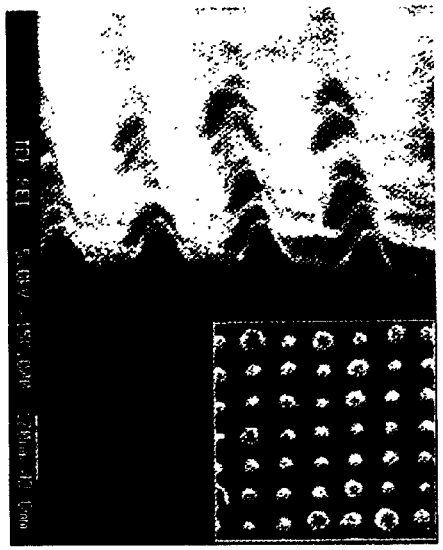
FIGS. 3a and 3b show photographs illustrating SEM images of islands shape actually formed by a reactive ion etching of a CoPt alloy using a Ti mask.
Figure 3B:
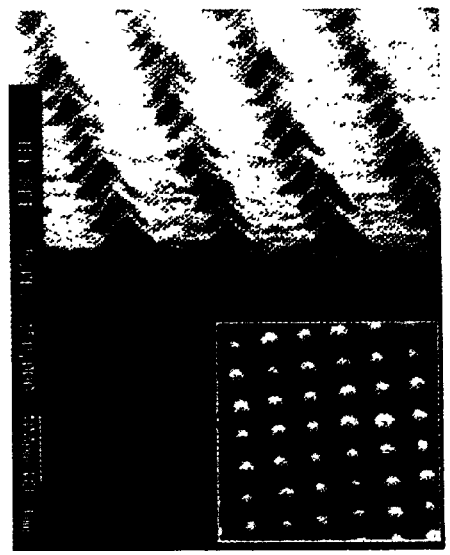
Figure 4A:
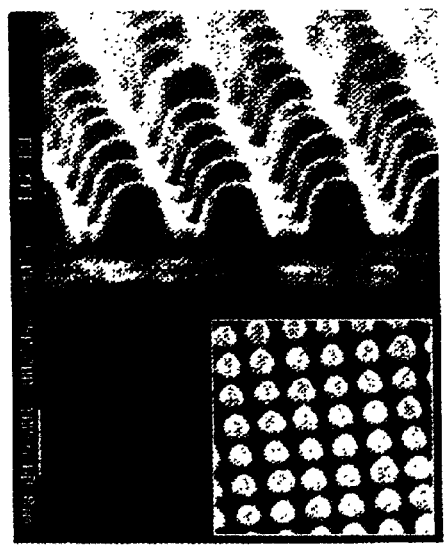
FIGS. 4a and 4b show photographs illustrating SEM images of islands shape actually formed by a reactive ion etching of a CoPt alloy using a Ta mask.
Figure 4B:
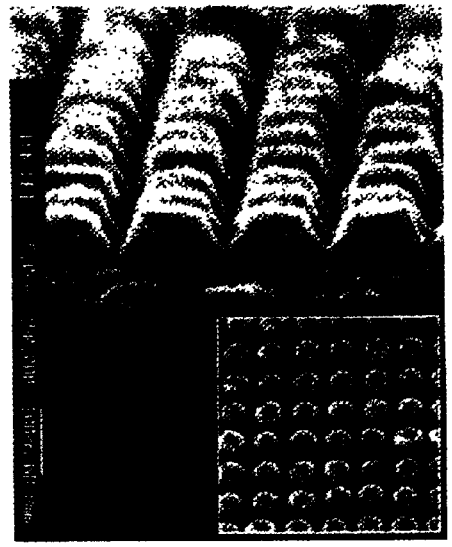

FIGS. 3a and 3b are photographs illustrating SEM images of islands shape actually formed by a reactive dry etching of a CoPt alloy using a Ti mask according to the conventional art under the aforementioned dry etching conditions, and FIGS. 4a and 4b are photographs illustrating SEM images of islands shape actually formed by a reactive ion etching of a CoPt alloy using a Ta mask according to the present invention under the aforementioned dry etching conditions. FIGS. 3a and 4a are SEM images after the etching but before exfoliation of the mask, and FIGS. 3b and 4b are SEM images after exfoliation of the mask, respectively.

As will be apparent from FIGS. 3a and 3b, if the mask was formed by the titanium, since the mask did not sufficiently remain after the dry etching and side etching was progressing, each island of the cobalt-platinum alloy finally formed was conical in shape. Contrary to this, as shown in FIGS. 4a and 4b, if the mask was formed by the tantalum, since the mask particularly its lower part sufficiently remained even after the dry etching, each island of the cobalt-platinum alloy finally formed was kept in good and precise shape.

Although in the aforementioned embodiment the mask is made of the tantalum, in a modification of the present invention, a tantalum nitride is used for the mask instead of the tantalum.

In the modification, namely, at the process shown in FIG. 1c, on the micro-patterned resist layer 13 and on the layer to be etched 12, a mask layer 14 of a tantalum nitride (TaN) is deposited. More concretely, for example, the tantalum nitride layer is deposited by the reactive sputtering method (nitrogenation during deposition) using a mixture gas plasma of nitrogen and argon under the following conditions.

Deposition Conditions of the Mask Layer

| | |
|---|---|
| Target | 99.995% purity tantalum |
| Background pressure | $9 \times 10^{-6}$ Pa |
| Entered gas | argon and nitrogen gas |
| Rate of gas flow | 30 sccm |
| Total gas pressure | 0.15 Pa (during deposition) |
| Ratio of nitgrogen gas | 0–60% |
| Applied power | DC 500 W |
| Distance between target and substrate | 300 mm |
| Rotation of substrate | None |
| Temperature of substrate | room temperature (cooling by cold water, no temperature control) |

When depositing the tantalum nitride, a typical sputtering method using a target of the tantalum nitride may be executed instead of the reactive sputtering method. Following processes in this modification are the same as these in the aforementioned embodiment.

Since the tantalum nitride (TaN) has a very large ratio of the etching rate (etching selective ratio) with respect to cobalt-platinum alloy (CoPt) which makes the layer to be etched 12. As a result, if the mask 14' is formed by this tantalum nitride, the micro-pattern can be precisely transferred on the work layer.

A nitrogen containing amine-family gas may be used other than the aforementioned ammonia ($NH_3$) gas, for the nitrogen containing compound gas added to the carbon monoxide gas as for a reaction gas in the dry etching process.

In the aforementioned embodiment and modification, an example for forming many islands with a size of 0.1 μm or less on a magnetic material to be worked. However, the present invention is applicable to other microfabrication of the magnetic material and also to a microfabrication of other material such as a semiconductor material.

Many widely different embodiments of the present invention may be constructed without departing from the spirit and scope of the present invention. It should be understood that the present invention is not limited to the specific embodiments described in the specification, except as defined in the appended claims.

What is claimed is:

1. A microfabrication method, comprising:

first forming a resist pattern on a cobalt-platinum alloy layer to be etched;

forming a patterned tantalum mask on said cobalt-platinum alloy comprising sputtering a tantalum mask layer using a tantalum target; and reactive dry etching said cobalt-platinum alloy layer using said tantalum mask, under a first reaction gas comprising carbon monoxide and a nitrogen containing gas, wherein said cobalt-platinum alloy layer is selectively etched.

2. The method of claim 1, said sputtering comprising sputtering under a gas comprising argon.

3. The method of claim 1, further comprising:

after said sputtering, removing from said cobalt-platinum alloy layer, said resist pattern having said mask layer deposited thereon, to form a patterned mask.

4. A microfabrication method, comprising:

first forming a resist pattern on a cobalt-platinum alloy layer to be etched;

forming a patterned tantalum nitride mask on said cobalt-platinum alloy layer comprising reactive-sputtering a tantalum nitride mask layer using a tantalum target under a second reaction gas comprising at least a nitrogen containing gas; and reactive dry etching said cobalt-platinum alloy layer using said tantalum nitride mask, under a first reaction gas comprising carbon monoxide and a nitrogen containing gas, wherein said cobalt-platinum alloy layer is selectively etched.

5. The method of claim 4, further comprising:

after said sputtering, removing from said cobalt-platinum alloy layer, said resist pattern having said mask layer deposited thereon, to form a patterned mask.

6. A microfabrication method, comprising:

first forming a resist pattern on a cobalt-platinum alloy layer;

forming a patterned tantalum nitride mask on said cobalt-platinum alloy layer to be etched comprising sputtering a tantalum nitride mask layer using a tantalum nitride target; and reactive dry etching said cobalt-platinum alloy layer using said tantalum nitride mask, under a first reaction gas comprising carbon monoxide and a nitrogen containing gas, wherein said cobalt-platinum alloy layer is selectively etched.

7. The method of claim 6, said sputtering comprising sputtering under a gas comprising argon.

8. The method of claim 6, further comprising:

after said sputtering, removing from said cobalt-platinum alloy layer, said resist pattern having said mask layer deposited thereon, to form a patterned mask.

* * * * *